United States Patent
Lammers

(10) Patent No.: US 6,594,176 B2
(45) Date of Patent: Jul. 15, 2003

(54) CURRENT SOURCE AND DRAIN ARRANGEMENT FOR MAGNETORESISTIVE MEMORIES (MRAMS)

(75) Inventor: Stefan Lammers, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/885,759

(22) Filed: Jun. 20, 2001

(65) Prior Publication Data

US 2002/0097602 A1 Jul. 25, 2002

Related U.S. Application Data

(60) Provisional application No. 60/263,909, filed on Jan. 24, 2001.

(51) Int. Cl.⁷ ................................................ G11C 11/14
(52) U.S. Cl. ................... 365/171; 365/189.08; 365/198; 365/214
(58) Field of Search ........................... 365/69, 63, 171, 365/173, 189.08, 189.09, 198, 214

(56) References Cited

U.S. PATENT DOCUMENTS

| | | | | | |
|---|---|---|---|---|---|
| 5,734,605 | A | * | 3/1998 | Zhu et al. ................... | 365/158 |
| 6,052,302 | A | * | 4/2000 | Moyer et al. ............... | 365/158 |
| 6,111,783 | A | * | 8/2000 | Tran et al. .................. | 365/171 |
| 6,163,477 | A | * | 12/2000 | Tran ........................... | 365/158 |
| 6,191,972 | B1 | * | 2/2001 | Miura et al. ................ | 365/158 |
| 6,191,973 | B1 | * | 2/2001 | Moyer ........................ | 365/171 |
| 6,256,224 | B1 | * | 7/2001 | Perner et al. ............... | 365/171 |

* cited by examiner

Primary Examiner—Richard Elms
Assistant Examiner—VanThu Nguyen
(74) Attorney, Agent, or Firm—Slater & Matsil, L.L.P.

(57) ABSTRACT

An MRAM device (400) having write paths with substantially uniform length and resistance for all memory cells within the memory array (411). CVC circuits are positioned with respect to the memory array (411) such that the write path length along conductive lines of the MRAM device (401) is substantially the same for all memory cells in the array (411), ensuring that the resistance along the write path is substantially uniform, and therefore, the amount of write current provided by the CVC circuits to write the cells of the memory array (411) is substantially the same.

25 Claims, 6 Drawing Sheets

CURRENT SOURCE AND DRAIN ARRANGEMENT FOR MAGNETORESISTIVE MEMORIES (MRAMS)

This patent claims the benefit of U.S. Provisional Patent Application Serial No. 60/263,909, filed Jan. 24, 2001, which is incorporated herein by reference.

TECHNICAL FIELD

The present invention relates generally to the fabrication of semiconductor devices, and more particularly to magnetoresistive random access memory (MRAM) devices.

BACKGROUND

Semiconductors are used for integrated circuits for electronic applications, including radios, televisions, and personal computing devices, as examples. One type of semiconductor device is a semiconductor storage device, such as a dynamic random access memory (DRAM) and flash memory, which use an electron charge to store information.

A more recent development in memory devices involves spin electronics, which combines semiconductor technology and magnetics. The spin of an electron, rather than the charge, is used to indicate the presence of a "1" or "0". One such spin electronic device is a magnetic random-access memory (MRAM), which includes conductive lines positioned perpendicular to one another in different metal layers, the conductive lines sandwiching a magnetic stack. The place where the conductive lines intersect is called a cross-point. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is stored in the alignment of magnetic moments. The resistance of the magnetic component depends on the moment's alignment. The stored state is read from the element by detecting the component's resistive state. A memory cell may be constructed by placing the conductive lines and cross-points in a matrix or array structure having rows and columns.

An advantage of MRAMs compared to traditional semiconductor memory devices such as DRAMs is that MRAMs can be made smaller and provide a non-volatile memory. For example, a personal computer (PC) utilizing MRAMs would not have a long "boot-up" time as with conventional PCs that utilize DRAMs. MRAMs permit the ability to have a memory with more memory bits on the chip than DRAMs or flash memories. Also, an MRAM does not need to be refreshed and has the capability of "remembering" the stored data.

Because MRAMs operate differently than traditional memory devices, they introduce design and manufacturing challenges.

SUMMARY OF THE INVENTION

The present invention provides an MRAM device having write pats having substantially the same amount of resistance for each memory cell in the array. Current/voltage control (CVC) circuits arc arranged such that the write paths to each memory cell within an MRAM array have substantially the same length, and therefore have substantially the same amount of resistance.

Disclosed is a preferred embodiment of a memory device, comprising a plurality of memory cells arranged in an array, a plurality of first conductive lines disposed beneath the memory cells, the first conductive lines being positioned in a first direction, a plurality of second conductive lines disposed above the memory cells, the second conductive lines being positioned in a second direction, the memory cells being located at cross-points of the first and second conductive lines, and a plurality of CVC circuits including a current source and a current drain, the CVC circuits being coupled at each end of the first and second conductive lines, wherein the memory cells are addressable by applying a current from one of the CVC circuits to a CVC circuit at the opposite end of the first and second conductive lines, wherein the CVC circuits are arranged so that the length of the first and second conductive lines between each current source and drain is substantially the same for each memory cell addressed.

Also disclosed is a preferred embodiment of a memory device having an array of memory cells coupled to a plurality of first and second conductive lines, the memory device comprising at least one CVC circuit coupled at each end of the first and second conductive lines, each CVC circuit including a current source and a current drain, wherein the CVC circuits are adapted to write information to the memory cells by applying a current from one CVC circuit to a CVC circuit at the opposite end of the first and second conductive lines, wherein the CVC circuits are arranged so that the length of the first and second conductive lines between opposing CVC circuits is substantially the same for each memory cell written to.

Further disclosed is a preferred embodiment of a method of manufacturing a memory device, comprising providing a plurality of memory cells arranged in an array, disposing a plurality of first conductive lines beneath the memory cells, the first conductive lines being positioned in a first direction, disposing a plurality of second conductive lines above the memory cells, the second conductive lines being positioned in a second direction, the memory cells being located at cross-points of the first and second conductive lines, and coupling a plurality of CVC circuits including a current source and a current drain at each end of the first and second conductive lines, wherein the memory cells are addressable by applying a current from one of the CVC circuits to a CVC circuit at the opposite end of the first and second conductive lines, wherein the CVC circuits are arranged so that the resistance of the first and second conductive lines between each current source and drain is substantially the same for each memory cell addressed.

Also disclosed is a preferred embodiment of a method of programming memory cells, comprising passing a first current through a first memory cell in a semiconductor memory device comprising an array of memory cells with a first conductive line, and passing a second current through a second memory cell with a second conductive line, wherein the first and second conductive lines have the substantially the same resistance.

Advantages of preferred embodiments of the invention include providing an arrangement of CVC circuits in MRAMs such that the conductive write path along wordlines and/or bitlines for each memory cell in an MRAM array have substantially the same length: therefore, the write path resistance and write currents for the memory cells in the array are substantially the same, independent of the position of the selected wordline or bitline. This is beneficial because neighboring memory cells are not disturbed when writing to a particular memory cell, which can occur when too high of a write current is used to write to a memory cell. The write margin or selectivity is increased due to the substantially equal write path lengths and resistances, in accordance with embodiments of the invention. Preferred embodiments of the present invention provide an MRAM array where the write current is nearly constant over all word and bitlines, and the resistance along the current path is very uniform. The CVC circuits are arranged so that the resistance or distance to the master wordlines is the same for all memory cells in the array. CVC circuits requiring a smaller amount of current can be utilized in accordance with an embodiment of the present invention.

BRIEF DESCRIPTION OF THE DRAWINGS

The above features of preferred embodiments of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments, and are not necessarily drawn to scale.

DETAILED DESCRIPTION OF PREFERRED EMBODIMENTS

Potential problems with MRAM device configurations and a description of preferred embodiments of the present invention will be discussed, followed by a discussion of some advantages of embodiments of the present invention.

To manufacture MRAM devices, typically, magnetic metal stacks are embedded in the back-end-of-line (BEOL) while manufacturing the integrated circuits (ICs). A magnetic stack comprises many different layers of metals with a thin layer of dielectric therebetween. The magnetic stack may have a total thickness of a few tens of nanometers, for example. For cross-point MRAM structures, the magnetic stack is usually located at the intersection of two metal wiring levels, for example, at the intersection of metal 2 (M2) and metal 3 (M3) layers that run in different directions positioned at an angle to one another. The top and bottom of the magnetic stacks typically contact the M2 and M3 wiring layer conductive lines, respectively.

Figure 1:
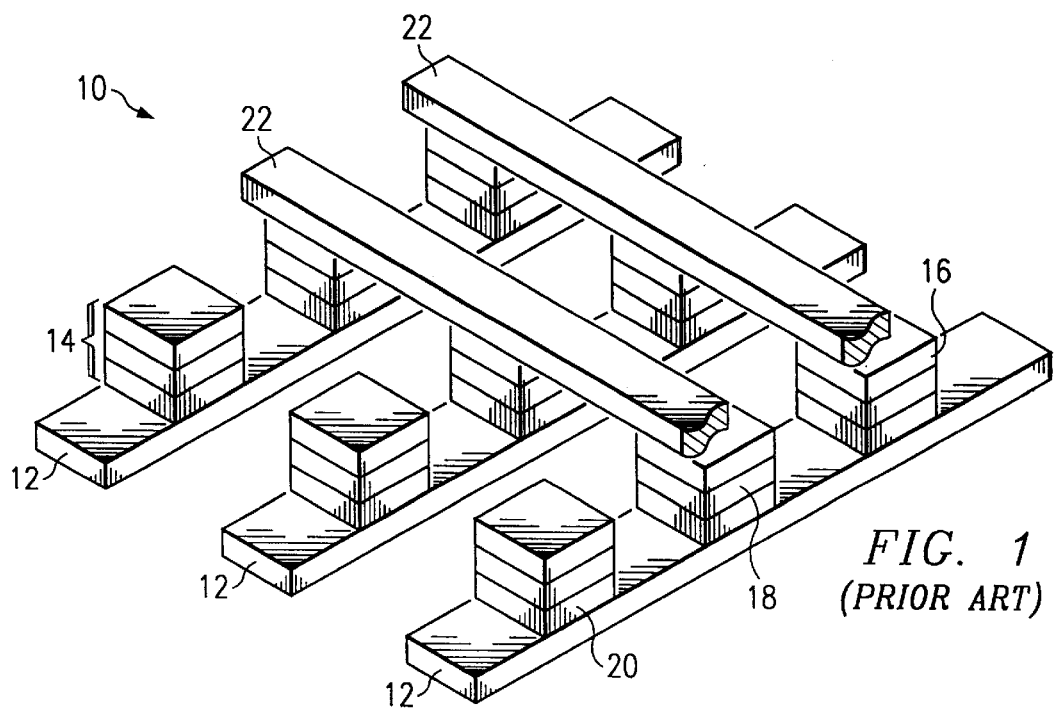
FIG. 1 illustrates a perspective view of a prior art MRAM device having magnetic stack memory cells arranged in an array, with wordlines and bitlines disposed below and above each memory cell for accessing the memory cells.

A prior art MRAM device 10 having conductive lines 12 and 22 running in a first and second direction and comprised of a conductive material such as aluminum or copper, for example, is shown in FIG. 1. A workpiece (not shown) is provided, typically comprising silicon oxide over silicon single-crystal silicon, for example. The workpiece may include other conductive layers or other semiconductor elements, e.g., transistors, diodes, etc. Compound semiconductors such as GaAs, InP, Si/Ge, and SiC may be used in place of silicon, for example.

A first inter-level dielectric layer (not shown) is deposited over the workpiece. The inter-level dielectric may comprise silicon dioxide, for example. The inter-level dielectric layer is patterned, for example, for vias, and etched. The vias may be filled with a metal such as copper, tungsten or other metals, for example. A metallization layer, e.g. an M2 layer, is formed next. If copper is used for the conductive lines 12, typically a damascene process is used to form the conductive lines 12. The dielectric is patterned and etched, and the trenches are filled with conductive material to form conductive lines 12 in the M2 layer.

Next, a magnetic stack 14 is formed over conductive lines 12. Magnetic stack 14 typically comprises a first magnetic layer 20 including a plurality of layers of materials such as PtMn, CoFe, Ru, and NiFe, for example. The first magnetic layer 20 is often referred to as a hard layer. Magnetic stack 14 also includes a dielectric layer 18, comprising $Al_2O_3$, for example, deposited over the first magnetic layer 20. The dielectric layer 18 is often referred to as a tunnel layer. Magnetic stack 14 also includes a second magnetic layer 16 comprising a multi-layer structure having similar materials as the first magnetic layer 20. Second magnetic layer 16 is often referred to as the soft layer. The first magnetic layer 20, dielectric layer 18 and second magnetic layer 16 are patterned to form magnetic stacks 14.

Conductive lines 22 within an M3 layer, for example, running in a different direction than conductive lines 12 are formed over magnetic stacks 14. If conductive lines 22 comprise copper, again, a damascene process is typically used. A dielectric layer (not shown) is deposited over magnetic stacks 14 and conductive lines 22. The dielectric layer is patterned and etched with trenches that will be filled with a conductive material to form conductive lines 22. Alternatively, a non-damascene process may be used to form conductive lines 12 and 22. Conductive lines 12 and 22 function as the wordlines and bitlines of the memory array 10.

The order of the magnetic stack 14 layers may be reversed, e.g., the hard layer 20 may be on the top and the soft layer 16 may be on the bottom of the insulating layer 18. Similarly, the wordlines 12 and bitlines 22 may be disposed either above or below the magnetic stacks 14.

In MRAMs, information is stored in the soft magnetic layer 16 of the magnetic stacks 14. To store the information, a magnetic field is necessary. This magnetic field is provided by a wordline and bitline current which is passed through conductive lines 12 and 22. CVC circuits are used to provide the write current for each wordline and bitline in the memory array. CVC circuits occupy a large amount of silicon area, and typically one or more CVC circuits are disposed on each side of the array.

Figure 2:
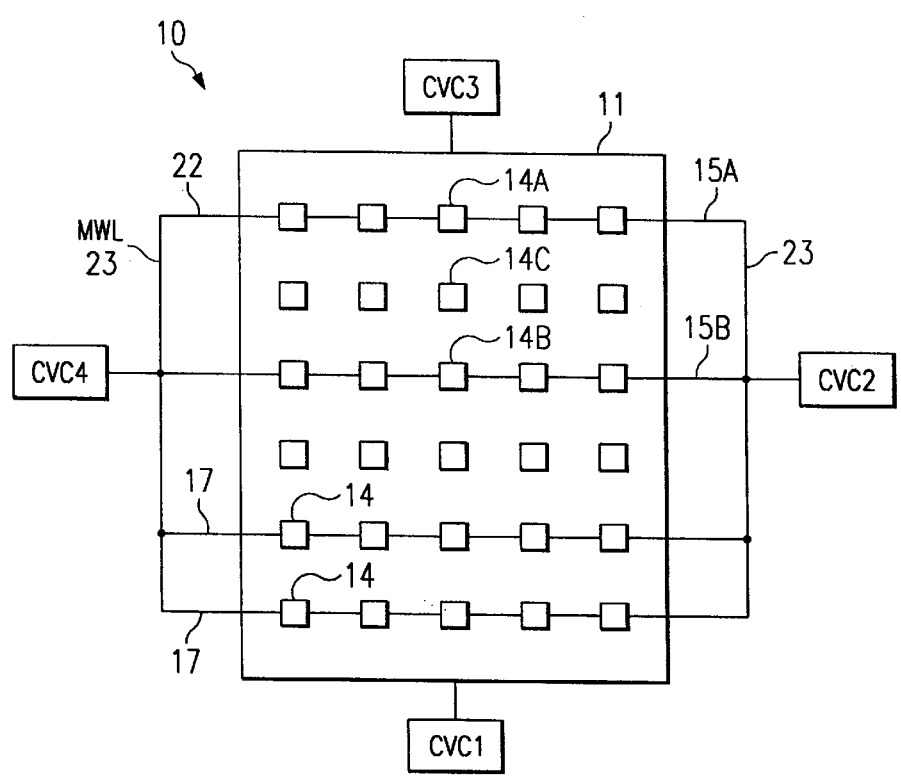
FIG. 2 shows an MRAM array having a CVC circuit positioned at each edge of the array, with the write paths to the various memory cells having varying lengths.
Figure 3:
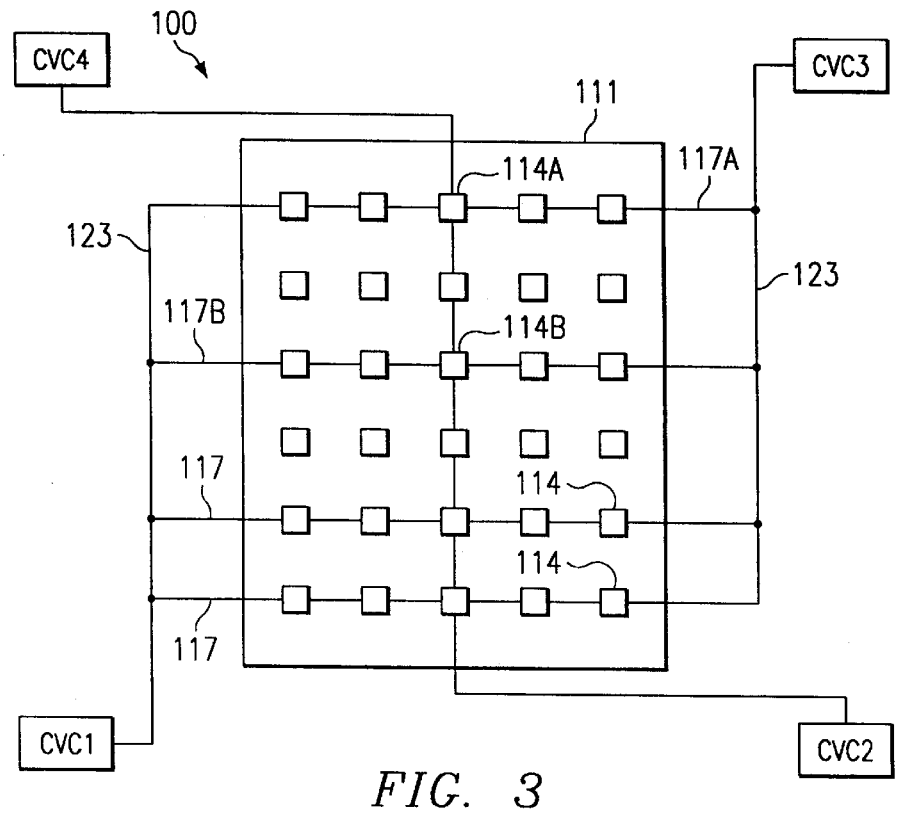
FIG. 3 illustrates an embodiment of the present invention having a CVC circuit positioned at each corner of the array, resulting in write paths for the various memory cells having substantially the same lengths.

FIGS. 2 and 3 illustrate the concept of an embodiment of the present invention in use with an MRAM array having only one CVC circuit on each side of the array. FIG. 2 shows a less preferred embodiment of an MRAM array 10, having wordline and bitline currents being provided by CVC circuits CVC1, CVC2, CVC3 and CVC4 located in a central region of the edges of the memory cell array 11. Each CVC circuit CVC1, CVC2, CVC3 and CVC4 comprises a current source and a current drain. The CVC circuits CVC1, CVC2, CVC3 and CVC4 are shared by the wordlines and bitlines to conserve silicon area. If, for example, the wordline current is passed from the left side of the array 11 to the right side of the array 11, the current source of the activated left CVC circuit CVC4 is used, and the current drain of the activated right CVC circuit CVC2 is used.

The resistance of the write path is a function of the length of the write path 15A/15B, e.g., the longer the path, the higher the resistance. The write path length/resistance also impacts the amount of write current provided by the CVC circuits CVC4/CVC2 to write to a memory cell 14A/14B, e.g., the longer the write path 15A/15B, the higher the voltage drop along the write path 15A/15B. This results in a different operation point in the CVC circuits CVC4/CVC2.

A problem with the less preferred embodiment of the MRAM 10 arrangement shown in FIG. 2 is that the write paths 15A/15B for the various memory cells 14A/14B in the array 11 have varying lengths, e.g., the write path 15A for memory cell 14A is longer than write path 15B for memory cell 14B. Write path 15A includes a longer portion of master word line (MWL) 23 than the portion of MWL 23 in write path 15B. Therefore, the resistance of the write path 15A is higher than the resistance of the write path 15B, and a higher write current is provided by the corresponding CVC circuit to write a logic state to the memory cell 14A than to write a logic state to the memory cell 14B. Thus, the write current for the various MRAM memory cells 14A/14B in the array 11 is not uniform, because of the varying write path lengths that cause a different write path resistance depending upon the position of the selected memory cell 14A/14B within the array 11.

A principle of embodiments of the invention is the desire to achieve a uniform write current for each memory cell 14A/14B in an MRAM array 10 independent of the position of the selected memory cell 14A/14B. If too high of a write current must be used to write to memory cells 14A, neighboring memory cells 14C may be written to unintentionally, resulting in device 10 failure, the loss of stored information, and/or the storage of incorrect information in memory cells 14A/14B/14C.

Embodiments of the present invention achieve technical advantages by providing an MRAM arrangement with write paths having substantially the same length and resistance for each memory cell in the array. The write margin or selectivity of memory cells in an MRAM array is increased due to the substantially equal write path lengths and resistances, in accordance with embodiments of the invention.

FIG. 3 shows a preferred embodiment of the present invention, comprising an MRAM device 100 including an array 111 of memory cells coupled to CVC circuits CVC1, CVC2, CVC3 and CVC4 by wordlines and bitlines 117/123. CVC circuits CVC1, CVC2, CVC3 and CVC4 are positioned at the corners of the array 111, resulting in write paths 117 that have substantially the same length and resistance for each memory cell 114 of the array 111. For example, write paths 117A and 117B have substantially the same length and resistance for memory cells 114A and 114B, for example. Although the MWL 123 on the left side of the array 111 is longer for write path 117A than on the right side of the array 111, the effective length of each write path 117 is substantially the same for each memory cell 114 in the array 111 because the total vertical distance is the substantially the same for each write path 117. Therefore, the write path 117A/117B resistances and lengths are independent of the position of the memory cell 114A/114B being written to, due to the novel positioning of the CVC circuits CVC1, CVC2, CVC3 and CVC4 with respect to the memory cells 114 of the array 111, in particular, at the corners of the array 111.

Figure 4:
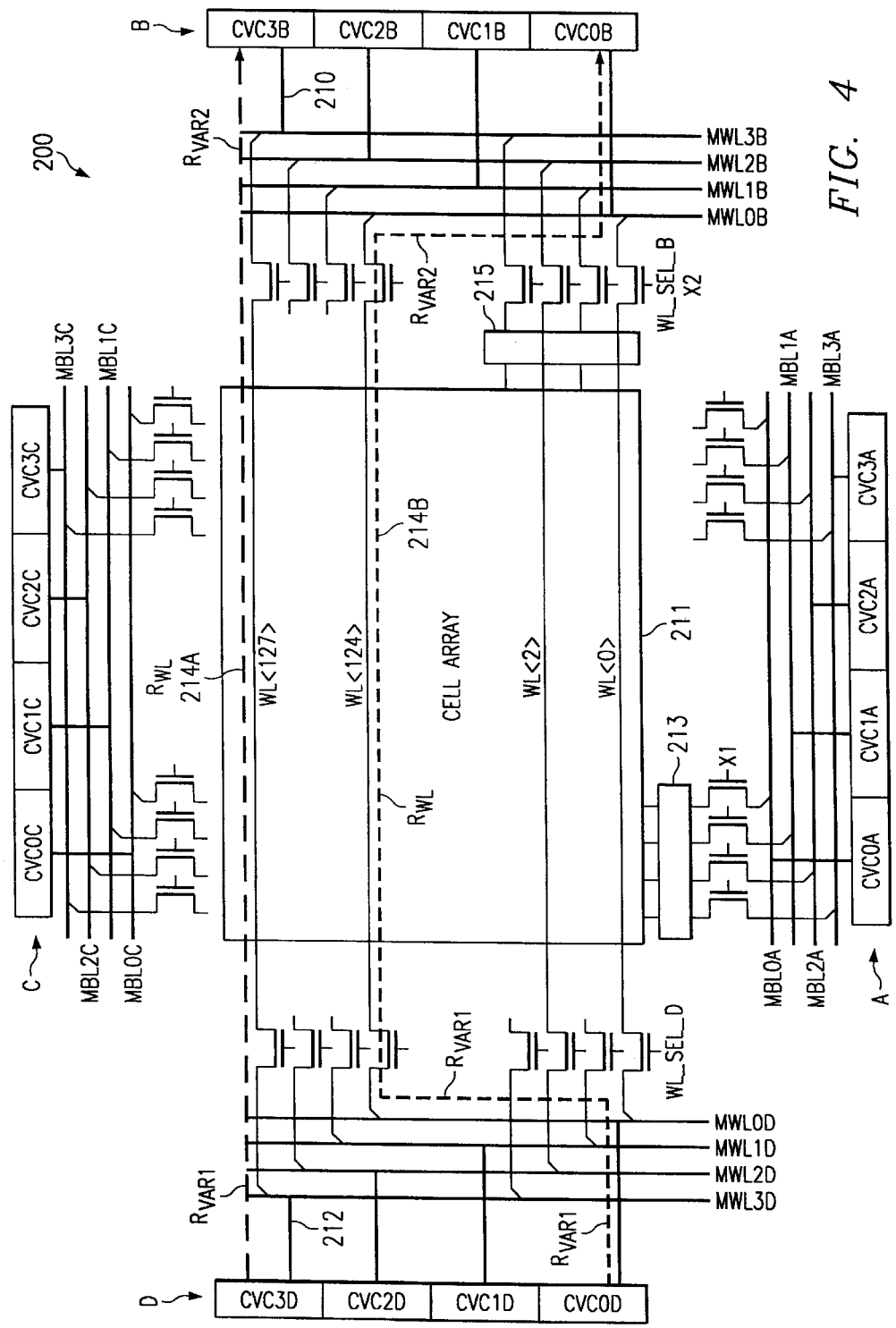
FIG. 4 illustrates an arrangement for an MRAM device having a memory cell array and a plurality of CVC circuits positioned around the edges of the cell array, resulting in varying length write paths for the memory cells in the array.

FIGS. 4 and 6–8 show embodiments of the present invention illustrating MRAMs having more than one CVC circuit at each edge of an MRAM array. FIG. 4 illustrates a less preferred embodiment of the invention, an arrangement for an MRAM 200 having an array 211 with several CVC circuits CVC0, CVC1, CVC2 and CVC3 positioned along each edge A, B, C and D of the MRAM cell array 211 (shown as CVC0A, CVC0B, etc.). Arranging the CVC circuits as shown in the arrangement of FIG. 4 produces the same problem evident in the circuit arrangement of the MRAM shown in FIG. 2: the write paths of the memory cells in the array 211 do not have the same length and therefore do not have the same resistance.

MRAM 200 includes a bitline decoder 213 and a wordline decoder 215 coupled to transistors X1 and X2 which are used to select the wordline and bitline for the memory cell to be written to. In general, for the embodiments of the invention described herein, wordline and bitline decoders are included in the memory designs, but the decoders are not necessarily shown in each figure herein. Transistors X1 are coupled to the master bitlines (MBL's) MBL0A, MBL1A, MBL2A, and MBL3A as shown. Similarly, transistors X2 are coupled to the MWL's MWL0B, MWL1B, MWL2B, and MWL3B.

The total resistance of a write path to a memory cell (not shown) comprises the constant wordline or bitline conductive line resistance and the resistance of the used part of the MWL conductive line. For example, for wordline WL<127>, the write path 214A includes a horizontal conductive line 212 from CVC3D to master wordline MWL3D ($R_{var1}$), and from MWL3D to WL<127>, continuing along WL<127>($R_{WL}$), and a horizontal conductive line from WL<127>to MWL3B ($R_{var2}$). However, for wordline WL<124>, the write path 214B includes a horizontal conductive line from CVC0D to master wordline MWL0D ($R_{var1}$), from MWL0D to WL<124>, continuing along WL<124>($R_{WL}$), then from WL<124>to MWL0B, and along the length of MWL0B to CVC0B ($R_{var2}$). The write path of WL<124>is longer than the write path of WL<127>in this MRAM 200 arrangement, because the resistances $R_{var2}$ of paths 214A and 214B are different, e.g., resistance $R_{var2}$ of path 214B is larger than resistance $R_{var2}$ of path 214B. Therefore, the total write path resistance of the different word lines 214A and 214B (and bit lines) differs, depending on the position of the selected wordline or bitline. For example, the total resistance of the write path 214A of WL<124>, including the relevant part of the corresponding MWL<0>, is much higher than the total resistance of the write path 214A of WL<127>. Therefore, the provided write current for WL<127>is not the same as the provided write current of WL<124>. The voltage drop created by the increased resistance affects the current source current.

Figure 5:
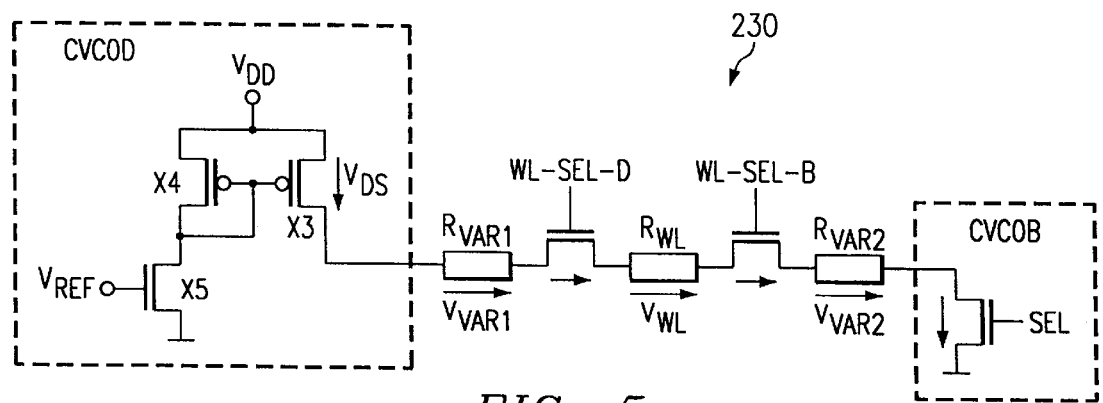
FIG. 5 shows a schematic diagram representative of the resistance along the write path between a CVC circuit on one side of the array and another CVC circuit on the opposite side of the array shown in FIG. 4.

FIG. 5 illustrates a schematic 230 that is representative of the resistance in the write path 214 of a memory cell in the array 211 shown in FIG. 4. A current source or CVC circuit such as CVC0D typically comprises a transistor X5 coupled to a transistor X4, as shown. A reference voltage $V_{ref}$ is applied to the gate of transistor X5, and the source of transistor X5 is coupled to ground. The source of transistor X4 is coupled to a voltage supply $V_{dd}$, the voltage source $V_{dd}$ also being coupled to a transistor X3. The schematic for the CVC circuit CVC0D is exemplary, and the CVC circuits CVCXY (where X=0, 1, 2, or 3 and Y=A, B, C, or D, where Y indicates an edge of the array 211) of embodiments of the present invention may alternatively comprise other schematics and configurations.

CVC circuit CVC0D is coupled to a horizontal conductive line represented by resistance $R_{var1}$ which represents the conductive etch line between a CVC0D on the left side of the array 211 to the etch line within the cell array. Resistance $R_{var1}$ is coupled to WL-SEL-D transistor (X2 in FIG. 4) which is coupled to a wordline decoder (215 in FIG. 4), not shown in the schematic. The WL-SEL-D transistor is adapted to select the wordline of the memory cell to be written to. Resistance $R_{WL}$ represents the resistance of the horizontal conductive wordline in the cell array 211.

WL-SEL-B transistor is adapted to select the wordline of the memory cell to be written to. The WL-SEL-B transistor is coupled to the MWL0B on the right side B of the array 211 having a resistance $R_{var2}$. MWL0B is coupled to the drain of a CVC circuit CVC0B on the right side of the array 211.

The voltage drop across $R_{var1}$ is $V_{var1}$, the voltage drop across $R_{WL}$ is $V_{WL}$, and the voltage drop across $R_{var2}$ is $V_{var2}$.

A problem with the arrangement shown in FIG. 4, evident from the schematic shown in FIG. 5, is that resistances $R_{var1}$ and $R_{var2}$ have different values for different memory cells in the array 211 because the length of the conductive line between the CVC circuits and the cell array 211 is different for each memory cell selected. This is described by the following equation:

$$I_{WL}=f(V_{DS}=V_{DD}-(V_{Var1}+V_{Var2}+V_{WL}+\ldots))$$

It is desired that the voltage drops for the different wordlines in the memory array 211 be constant, to achieve the same wordline write current for each wordline:

$$V_{var1}+V_{var2}=const\ I_{WL} const.$$

Because the voltage drops $V_{var1}$ and $V_{var2}$ are different in the MRAM 200 arrangement shown in FIG. 4, a different amount of write current $I_{WL}$ will be provided to write to each memory cell in the cell array 211.

Advantageously, it is recognized in accordance with embodiments of the present invention is that in order to obtain the same write current independent of the position of the addressed wordline, it is necessary that the write path resistance for each memory cell have approximately the same value within the array 211.

Figure 6:
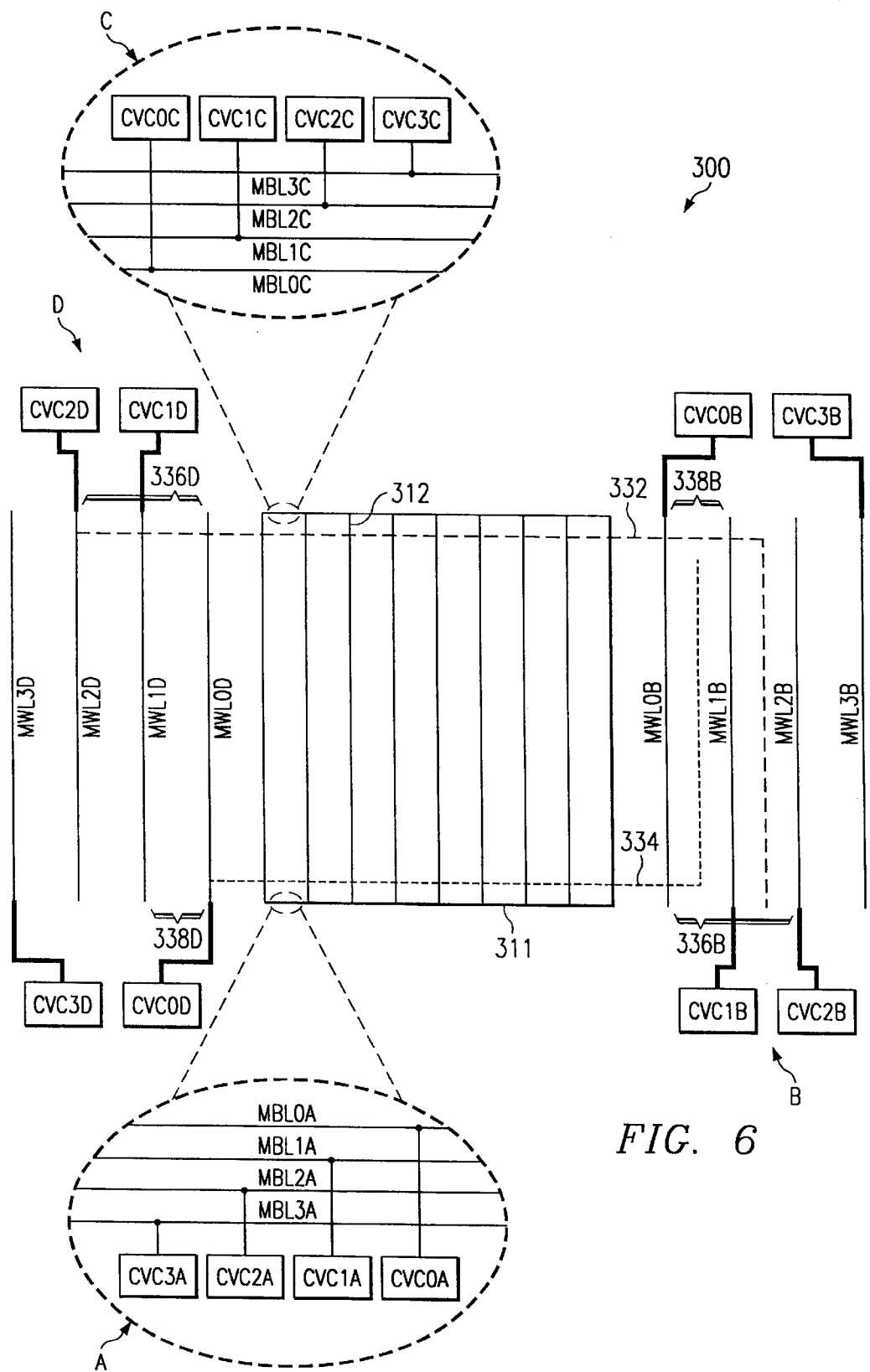
FIG. 6 illustrates an embodiment of the invention having CVC circuits at the corners of the array.

FIG. 6 illustrates an arrangement for an MRAM device 300 in accordance with a preferred embodiment of the present invention. Cell array 311 comprises a plurality of memory cells (not shown) comprising magnetic stacks for an MRAM that are addressable and may be written to by sending current along wordlines and bitlines 312 of the cell array 311. Rather than being placed along the edge of the cell array 311 at B and D as in the arrangement shown in FIG. 4, CVC circuits CVC0D, CVC1D, CVC2D, CVC3D, CVC0B, CVC1B, CVC2B, and CVC3B are placed at the corners of the cell array 311. This configuration creates a more uniform resistance in the write paths to each memory cell by making the distance along the conductive lines in the write path substantially the same for each memory cell being addressed. For example, write path 332 between CVC circuits CVC2D and CVC2B is substantially the same length as the write path 334 between CVC0D and CVC0B. Both write paths 332 and 334 extend the length of an entire wordline and bitline 312 because the CVC circuits are located in the corners of the cell array 311.

Although FIG. 6 shows the CVC circuits for the wordlines located at the corners of the array 311, the CVC circuits for the wordlines or bitlines, or both, may be placed at the corners of the array 311, in accordance with embodiments of the present invention.

A further improvement may be made to the MRAM 300 arrangement shown in FIG. 6, in accordance with a preferred embodiment of the present invention. Note that the distance from the CVC circuits to the wordlines varies depending on the CVC circuit used. For example, CVC circuits CVC2D and CVC2B are located a distance 336D and 336B from the array 311, respectively. Distances 336D and 336B are greater than distances 338D and 338B that CVC1D and CVC1B are located away from the array 311. Therefore, a difference in the length of the write paths 332/334 still exists in the arrangement of the MRAM 300 shown, although the design is substantially improved from the arrangement shown in FIG. 4.

Figure 7:
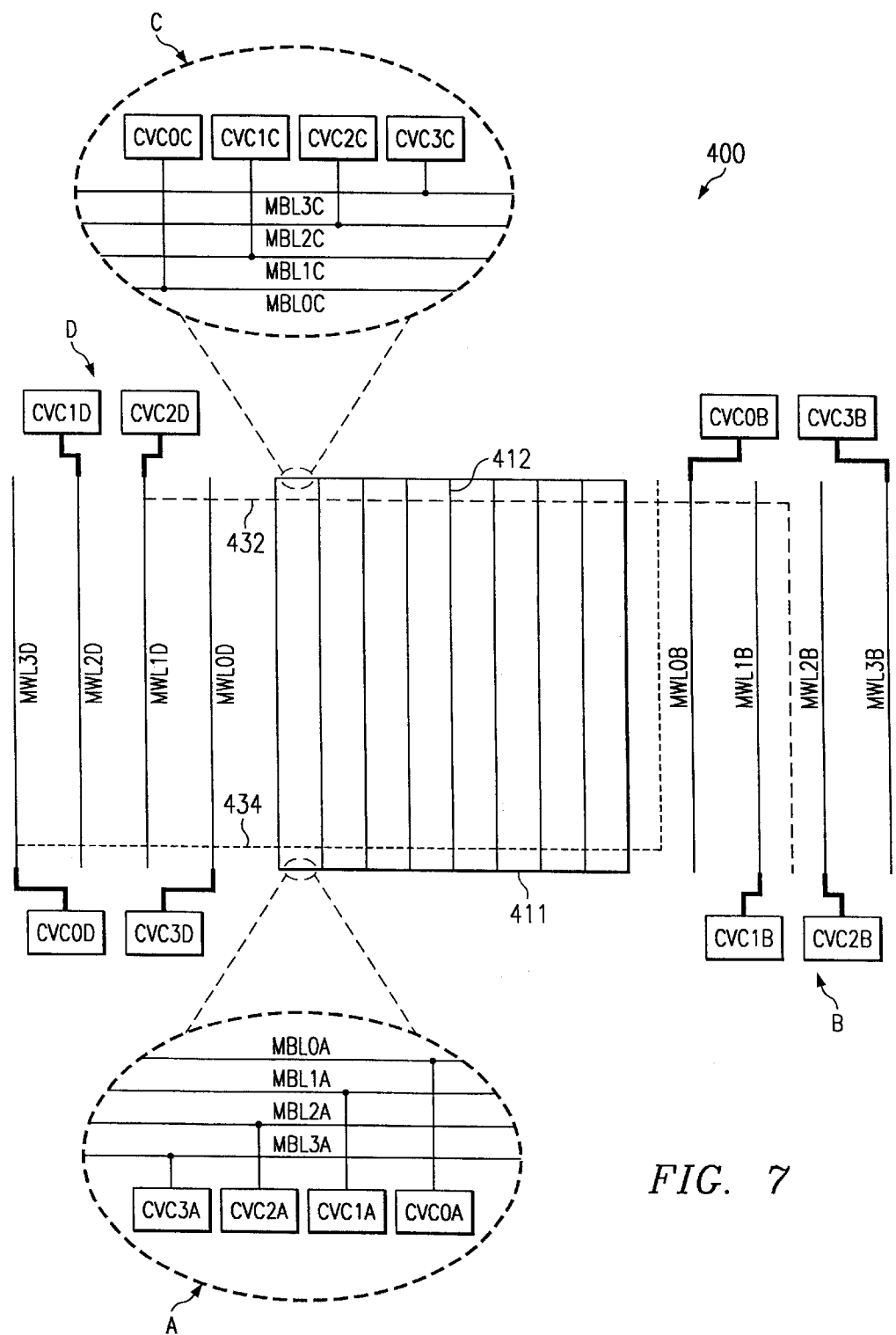
FIG. 7 illustrates another embodiment of the present invention having CVC circuits at the corners of the array and with the CVC circuits positioned to minimize the distance between opposing CVC circuits.

FIG. 7 shows a preferred embodiment of the present invention having CVC circuits located in the corners of the MRAM device 400, as in FIG. 6. However, in FIG. 7, the order of the CVC circuits is reversed in one corner to further ensure that the write path is equal for all memory cells within the array.

Another novel feature of the MRAM 300/400 arrangements shown in FIGS. 6 and 7 is that the order of the CVC circuits CVC0C, CVC1C, CVC2C, and CVC3C along the top edge C of the array 311/411 is reversed with respect to the CVC circuits CVC3A, CVC2A, CVC1A, and CVC0A along the bottom edge A of the array 311/411. This reversal of CVC circuit order is beneficial in equalizing the length of the write paths for all memory cells in the array 311/411.

Figure 8:
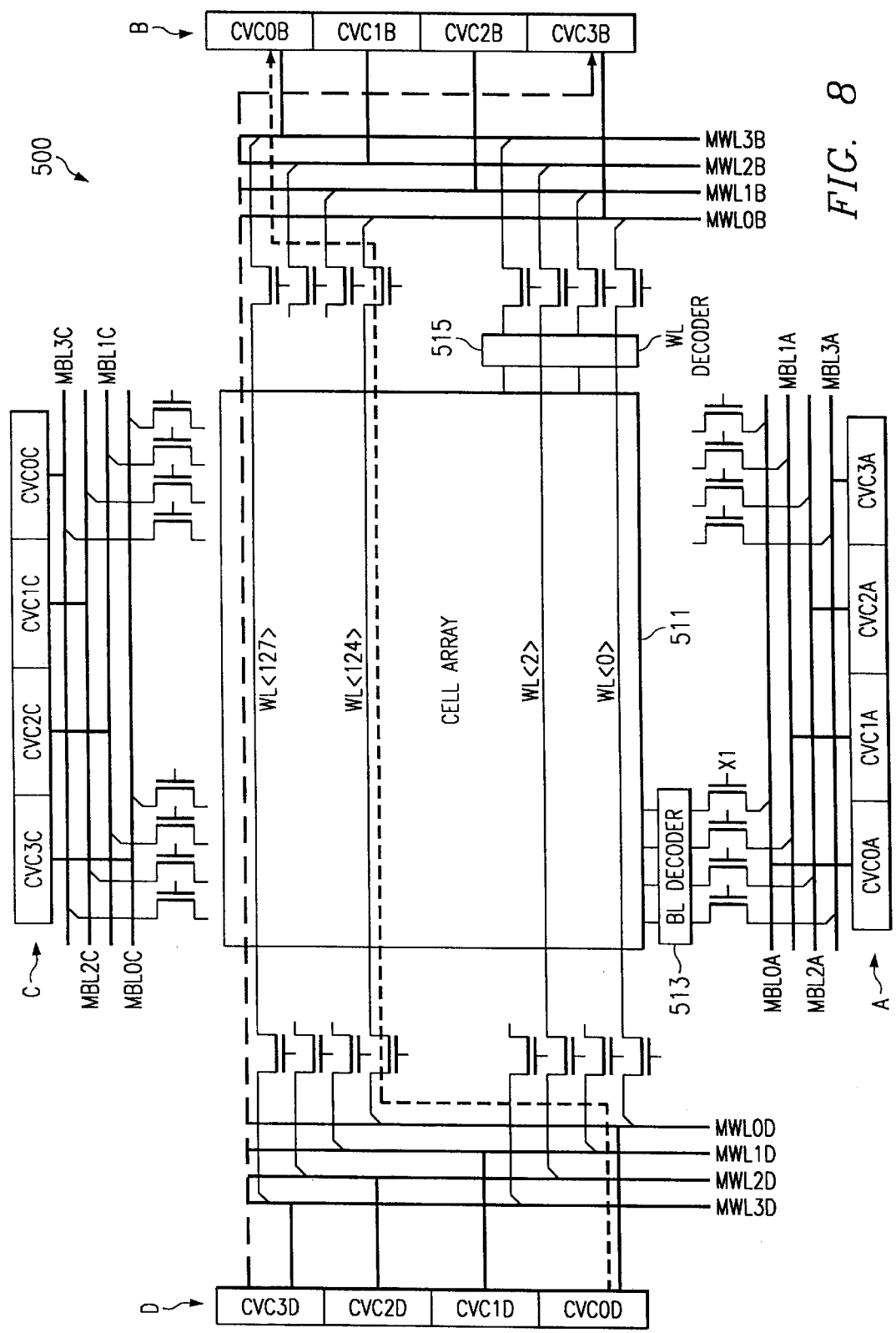
FIG. 8 illustrates an arrangement for an MRAM device in accordance with an embodiment of the present invention having CVC circuits positioned along the horizontal and vertical edges of the memory array, with the CVC circuits positioned to minimize the distance between opposing CVC circuits.

FIG. 8 illustrates another preferred embodiment of the present invention that minimizes the difference in the resistance of the write paths of memory cells. The MRAM 500 arrangement includes CVC circuits are positioned along the left edge, right edge, top, and bottom of the cell array 511, rather than at the corners of the array as in FIGS. 6 and 7. Four CVC circuits are shown along each edge, although preferably two or more CVC circuits are placed along each edge in accordance with an embodiment of the present invention. For example, CVC circuits CVC3D, CVC2D, CVC1D and CVC0D are positioned from top to bottom along the left vertical side D of the cell array 511, and CVC circuits CVC0B, CVC1B, CVC2B and CVC3B are positioned from top to bottom along the right vertical side B of the cell array 511. Similarly, CVC circuits CVC3C, CVC2C, CVC1C and CVC0C are positioned from left to right along the top side C of the cell array 511, and CVC circuits CVC0A, CVC1A, CVC2A and CVC3A are positioned from top to bottom along the bottom side A of the cell array 511. Reversing the order of opposing CVC circuits is beneficial because the resistance of the path for writing to a memory cell within the array 511 is made more uniform, because the distance between a CVC circuit on the left side of the array and the CVC circuit on the right side of the array is made more uniform, for example. Note that the master wordlines (MWL) and master bitlines (MBL) are used to address the various wordlines (WL0, WL2, WL124, and WL127) of the array 211 using a wordline decoder 515 or a bitline decoder 513 for the bitlines.

Although embodiments of the invention are described herein with reference to an application in MRAM devices, embodiments of the invention are also beneficial in other types of semiconductor memory devices, particularly those in which writing to the memory cells is accomplished by applying a current, rather than applying a voltage, for example. Embodiments of the invention are also useful in non-cross-point MRAM devices such as in MRAMs having transistor array architectures. Embodiments of the invention are also useful in MRAM arrays having a plurality of stacked memory cells, for example.

Four CVC circuits are shown at either side or corners of the memory array in several figures herein. However, one or more CVC circuit may be utilized in accordance with embodiments of the present invention, for example, 4, 8, 16 or more.

In FIGS. 6 and 7, CVC circuits are shown in the corners of the array for only the wordlines: however, the CVC circuits for the wordlines, bitlines, or both may be positioned in the array corners in accordance with embodiments of the present invention.

Embodiments of the present invention achieve technical advantages as an arrangement for CVC circuits of an MRAM device that ensures a substantially uniform write current for all memory cells within the array. Advantages of embodiments of the invention include providing a way of arranging CVC circuits in MRAMs so that write paths for each memory cell have approximately the same resistances, therefore the write currents for each memory cell are the same independent of the position of the selected wordline and/or bitline. This is beneficial in that it helps ensure that neighboring memory cells are not disturbed when writing to a particular memory cell, resulting in the ability to more accurately store logic states in a memory device. The write margin or selectivity is increased due to the substantially equal write path lengths and resistances, in accordance with embodiments of the invention. Embodiments of the present invention provide an MRAM array where the write current is nearly constant over all wordlines and bitlines, and the length and resistance of the current path is very uniform. The CVC circuits are arranged so that the resistance or distance to the master wordlines is minimized. CVC circuits requiring a smaller amount of current can be utilized in accordance with an embodiment of the present invention.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of embodiments of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A memory device, comprising:
    a plurality of memory cells arranged in an array;
    a plurality of first conductive lines disposed beneath the memory cells, the first conductive lines being positioned in a first direction;
    a plurality of second conductive lines disposed above the memory cells, the second conductive lines being positioned in a second direction, the memory cells being located at cross-points of the first and second conductive lines; and
    a plurality of current/voltage control (CVC) circuits including a current source and a current drain, the CVC circuits being coupled at each end of the first and second conductive lines, wherein the memory cells are addressable by applying a current from one of the CVC circuits to a CVC circuit at the opposite end of the first and second conductive lines, wherein the CVC circuits are arranged so that the length of the first and second conductive lines between each current source and drain is substantially the same for each memory cell addressed.

2. The memory MRAM device according to claim 1, wherein the array comprises a left vertical edge, a right vertical edge, a bottom horizontal edge, and a top horizontal edge, wherein some of the CVC circuits are positioned along the vertical edges of the array, and wherein some of the CVC circuits are positioned along the horizontal edges of the array.

3. The memory device according to claim 2, wherein the order of the left vertical edge CVC circuits is reversed from the order of the right vertical edge CVC circuits.

4. The memory device according to claim 2, wherein the order of the bottom horizontal edge CVC circuits is reversed from the order of the top horizontal edge CVC circuits.

5. The memory device according to claim 1, wherein the array comprises a top right corner, a bottom right corner, a top left corner, and a bottom left corner, wherein some of the CVC circuits are positioned at the top right corner and bottom left corner, and wherein some of the CVC circuits are positioned at the top left corner and bottom right corner.

6. The memory device according to claim 5, wherein the order of the top right corner CVC circuits is reversed from the order of the bottom left corner CVC circuits.

7. The memory device according to claim 5, wherein the order of the top left corner CVC circuits is reversed from the order of the bottom right corner CVC circuits.

8. The memory device according to claim 1 wherein each memory cell is programmable by running a write current through a first and second conductive line.

9. The memory device according to claim 8 wherein each memory cell comprises a magnetic stack.

10. The memory device according to claim 9 wherein the device comprises a magnetoresistive random access memory (MRAM).

11. A memory device having an array of memory cells coupled to a plurality of first and second conductive lines, the memory device comprising:
    at least one current/voltage control (CVC) circuit coupled to each end of the first and second conductive lines, each CVC circuit including a current source and a current drain, wherein the CVC circuits are adapted to write information to the memory cells by applying a current from one CVC circuit current source to a CVC circuit current drain at the opposite end of the first and second conductive lines, wherein the CVC circuits are arranged so that the length of the first and second conductive lines between the current source and current drain of opposing CVC circuits is substantially the same for each memory cell written to.

12. The memory device according to claim 11, wherein the array comprises a left vertical edge, a right vertical edge, a bottom horizontal edge, and a top horizontal edge, wherein some of the CVC circuits are positioned along the vertical edges of the array, and wherein some of the CVC circuits are positioned along the horizontal edges of the array.

13. A memory device having an array of memory cells coupled to a plurality of first and second conductive lines, the memory device comprising:
at least one current/voltage control (CVC) circuit coupled to each end of the first and second conductive lines, each CVC circuit including a current source and a current drain, wherein the CVC circuits are adapted to write information to the memory cells by applying a current from one CVC circuit to a CVC circuit at the opposite end of the first and second conductive lines, wherein the CVC circuits are arranged so that the length of the first and second conductive lines between opposing CVC circuits is substantially the same for each memory cell written to, wherein the array comprises a left vertical edge, a right vertical edge, a bottom horizontal edge, and a top horizontal edge, wherein some of the CVC circuits are positioned along the vertical edges of the array, wherein some of the CVC circuits are positioned along the horizontal edges of the array, wherein the order of the left vertical edge CVC circuits is reversed from the order of the right vertical edge CVC circuits, and wherein the order of the bottom horizontal edge CVC circuits is reversed from the order of the top horizontal edge CVC circuits.

14. The memory device according to claim 11, wherein the array comprises a top right corner, a bottom right corner, a top left corner, and a bottom left corner, wherein some of the CVC circuits are positioned at the top right corner and bottom left corner, and wherein some of the CVC circuits are positioned at the top left corner and bottom right corner.

15. A memory device having an array of memory cells coupled to a plurality of first and second conductive lines, the memory device comprising:
at least one current/voltage control (CVC) circuit coupled to each end of the first and second conductive lines, each CVC circuit including a current source and a current drain, wherein the CVC circuits are adapted to write information to the memory cells by applying a current from one CVC circuit to a CVC circuit at the opposite end of the first and second conductive lines, wherein the CVC circuits are arranged so that the length of the first and second conductive lines between opposing CVC circuits is substantially the same for each memory cell written to, wherein the array comprises a top right corner, a bottom right corner, a top left corner, and a bottom left corner, wherein some of the CVC circuits are positioned at the top tight corner and bottom left corner, and wherein some of the CVC circuits are positioned at the lop left corner and bottom right corner, wherein the order of the top right corner CVC circuits is reversed from the order of the bottom left corner CVC circuits, wherein the order of the top left corner CVC circuits is reversed from the order of the bottom right corner CVC circuits.

16. The memory device according to claim 11 wherein each memory cell comprises a magnetic stack.

17. The memory device according to claim 16 wherein the memory device comprises a magnetoresistive random access memory (MRAM).

18. The memory device according to claim 17 wherein the memory device comprises a transistor array MRAM.

19. The memory device according to claim 13 wherein the memory device comprises a transistor array MRAM.

20. The memory device according to claim 15 wherein the memory device comprises a transistor array MRAM.

21. In a semiconductor memory device comprising an array of memory cells coupled to and addressable by a plurality of wordlines and bitlines, a current/voltage control (CVC) circuit being coupled at each end of the plurality of wordlines and bit lines, each CVC circuit including a current source and a current drain, a method of programming memory cells, comprising:
passing a first wordline current from a CVC circuit current source through a first memory cell along a first wordline to a CVC circuit current drain at the opposite end of the first wordline while passing a first bitline current through the first memory cell along a first bitline; then
passing a second wordline current from a CVC circuit current source through a second memory cell along a second memory cell along a second wordline to a CVC circuit current drain at the opposite end of the second wordline while passing a second bitline current through the second memory cell along a second bitline, wherein the first and second wordlines between the CVC circuit current source and current drain have substantially the same resistance.

22. The method according to claim 21 wherein the first and second wordline currents are substantially the same.

23. The method according to claim 21, wherein the memory device includes a current/voltage control (CVC) circuit coupled at each end of the wordlines and bitlines, the CVC circuits comprising a current source and a current drain, wherein the method includes:
passing the wordline first current from a CVC circuit current source to a CVC circuit current drain while passing the first bitline current from a CVC circuit current source to a CVC circuit current drain; and
passing the wordline second current from a CVC circuit current source to a CVC circuit current drain while passing the second bitline current from a CVC circuit current source to a CVC circuit current drain.

24. The method according to claim 21, wherein the first and second bitlines have substantially the same resistance.

25. The method according to claim 24, wherein the first and second bitline currents are substantially the same.

* * * * *